United States Patent
Hung

(10) Patent No.: US 7,414,850 B2
(45) Date of Patent: Aug. 19, 2008

(54) HEAT DISSIPATION MODULE FOR ELECTRONIC DEVICE

(75) Inventor: Jui-Wen Hung, Taipei Hsien (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 95 days.

(21) Appl. No.: 11/309,624

(22) Filed: Sep. 1, 2006

(65) Prior Publication Data

US 2008/0013285 A1 Jan. 17, 2008

(30) Foreign Application Priority Data

Jul. 14, 2006 (CN) .................... 2006 1 0061650

(51) Int. Cl.
*H05K 7/20* (2006.01)

(52) U.S. Cl. .................. 361/719; 361/687; 361/700; 361/704; 165/80.3; 165/185; 174/15.2

(58) Field of Classification Search .......... 361/700, 361/719, 670–671, 687, 695; 165/80.3–80.4, 165/104.33, 185, 121, 104.26; 174/15.2, 174/16.1, 16.3; 257/E23.086, E23.099
See application file for complete search history.

(56) References Cited

U.S. PATENT DOCUMENTS

| | | | | |
|---|---|---|---|---|
| 6,301,107 B1 * | 10/2001 | Lev et al. | ..................... | 361/687 |
| 6,400,565 B1 * | 6/2002 | Shabbir et al. | .............. | 361/687 |
| 6,567,269 B2 * | 5/2003 | Homer et al. | ............... | 361/700 |
| 6,754,077 B2 * | 6/2004 | Lo et al. | ..................... | 361/700 |
| 6,883,594 B2 * | 4/2005 | Sarraf et al. | ........... | 165/104.33 |
| 7,283,364 B2 * | 10/2007 | Refai-Ahmed et al. | ...... | 361/719 |
| 7,310,227 B2 * | 12/2007 | Kusamoto et al. | ........... | 361/695 |
| 7,312,997 B2 * | 12/2007 | Huang et al. | ................. | 361/704 |
| 2004/0188079 A1 * | 9/2004 | Chiou et al. | ................ | 165/185 |

* cited by examiner

*Primary Examiner*—Boris Chervinsky
*Assistant Examiner*—Courtney L Smith
(74) *Attorney, Agent, or Firm*—Jeffrey T. Knapp

(57) ABSTRACT

A heat dissipation module for removing heat from a heat-generating electronic component includes a base (106) and a clip (40, 40a). The clip includes a connecting arm (42, 42a) and a securing arm (44, 44a) for locking the base to the heat-generating electronic component. The connecting arm engages with the base. The securing arm extends from the contacting arm and is curve-shaped with a free end thereof being for being depressed whereby the securing arm exerts a downward force on the base so that the base and the electronic component can have an intimate contact with each other.

17 Claims, 5 Drawing Sheets

HEAT DISSIPATION MODULE FOR ELECTRONIC DEVICE

FIELD OF THE INVENTION

The present invention relates generally to a heat dissipation module, and in particular to a heat dissipation module incorporating a clip for mounting the heat dissipation module on a circuit board to effectively dissipate heat generated by an electronic device on the circuit board. The clip has such a configuration that a steady pressure generated by the clip on the electronic device can be easily obtained.

DESCRIPTION OF RELATED ART

With the advance of large scale integrated circuit technology, high speed processors have become faster and faster, which causes the processors to generate more redundant heat. Redundant heat if not quickly removed will have tremendous influence on the system stability and performance. Usually, people install a heat sink on the central processor to assist its heat dissipation, whilst a clip is required for mounting the heat sink to the processor.

FIG. 5 shows a clip in accordance with related art for mounting a heat sink (not shown) to a processor (not shown) in accordance with related art. The clip is T-shaped, including a locking portion 42c and a securing portion 44c. The securing portion 44c is elongated and with two ends. The locking portion 42c extends transversely from a middle of the securing portion 44c. The locking portion 42c defines two locking holes 421c therein. Screws (not shown) extend through the locking holes 421c to lock the clip to the heat sink. The securing portion 44c defines two securing holes 441c in the two ends thereof. When the heat sink with the clip fixed thereon is mounted to a circuit board (not shown) on which the processor is arranged, rivets or screws extend through the securing holes 441c into corresponding holes defined in the circuit board to lock the heat sink to the circuit board. Thus the heat sink with the clip is fixedly mounted on the circuit board by riveting or screwing. The pressure exerted on the processor is generated by the downward deflection of the clip. However, for the requirement of compactness of the electronic device, the size of the clip is limited. A distance between each securing hole 441c of the securing portion 44c and the locking portion 42c is limited. Such a limitation causes that when the deflection of the clip has a little variation, the pressure exerted by the clip on the processor changes enormously, which results in that the pressure exerted on the processor can not be easily controlled.

What is needed, therefore, is a heat dissipation module incorporating a clip for mounting the heat dissipation module to a circuit board, wherein the clip is so configured that the clip can exert a steady pressure to the processor even when the deflection of the clip has a large variation.

SUMMARY OF THE INVENTION

According to a preferred embodiment of the present invention, a heat dissipation module includes a base and a clip for securing the base to a heat-generating electronic component. The clip includes a connecting arm engaging with the base and at least one securing arm for securing the base to the heat-generating electronic component. The at least one securing arm bends curvedly from the connecting arm and has an end remote from the connecting arm. The remote end is securely fixed to a circuit board on which the heat-generating electronic component is mounted.

Other advantages and novel features of the present invention will be drawn from the following detailed description of the preferred embodiment of the present invention with attached drawings, in which:

BRIEF DESCRIPTION OF THE DRAWINGS

Many aspects of the present heat dissipation module can be better understood with reference to the following drawings. The components in the drawings are not necessarily drawn to scale, the emphasis instead being placed upon clearly illustrating the principles of the present heat dissipation module. Moreover, in the drawings, like reference numerals designate corresponding parts throughout the several views.

DETAILED DESCRIPTION OF THE INVENTION

Figure 1:
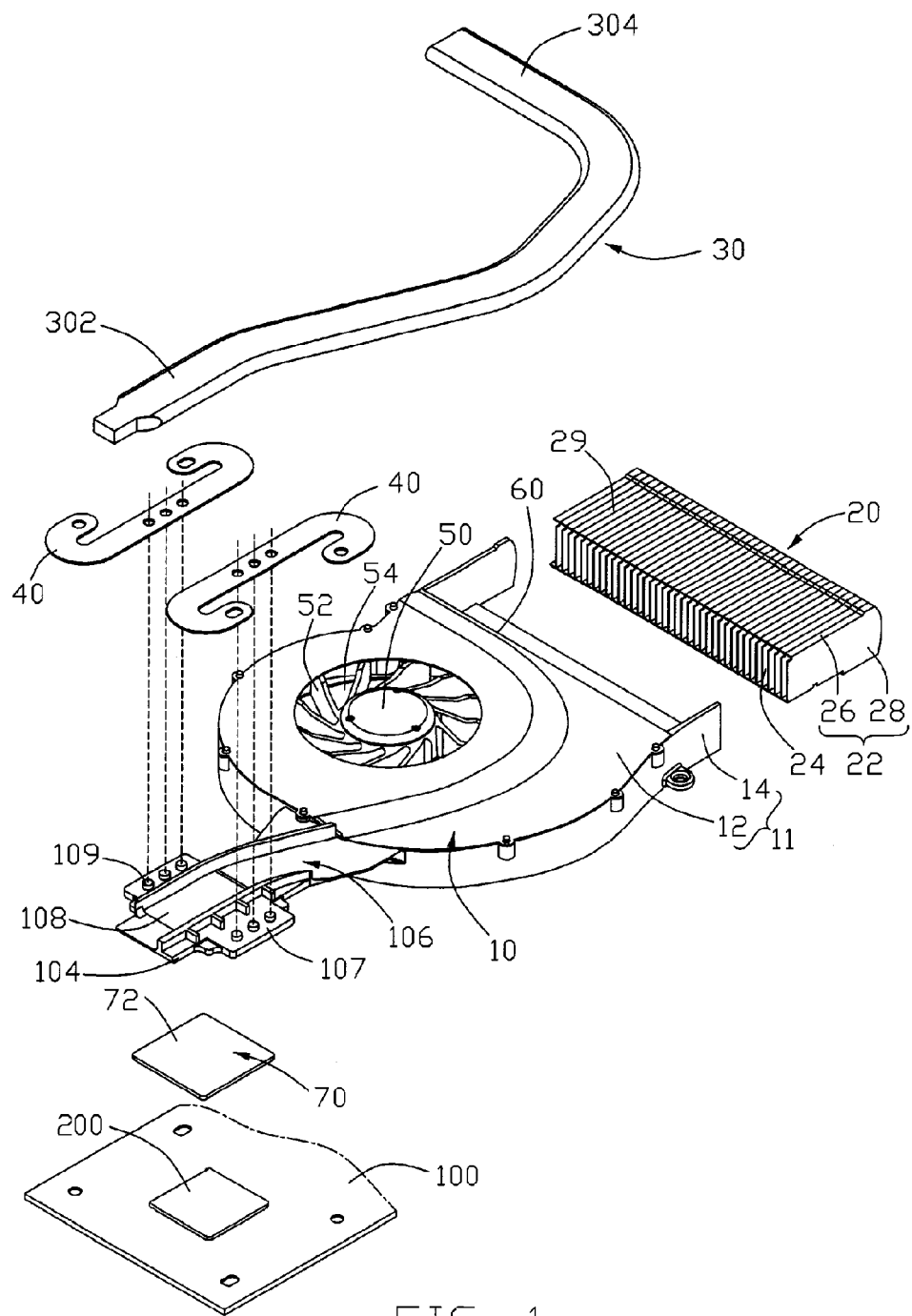
FIG. 1 is an exploded, isometric view of a heat dissipation module in accordance with a preferred embodiment of the present invention.
Figure 2:
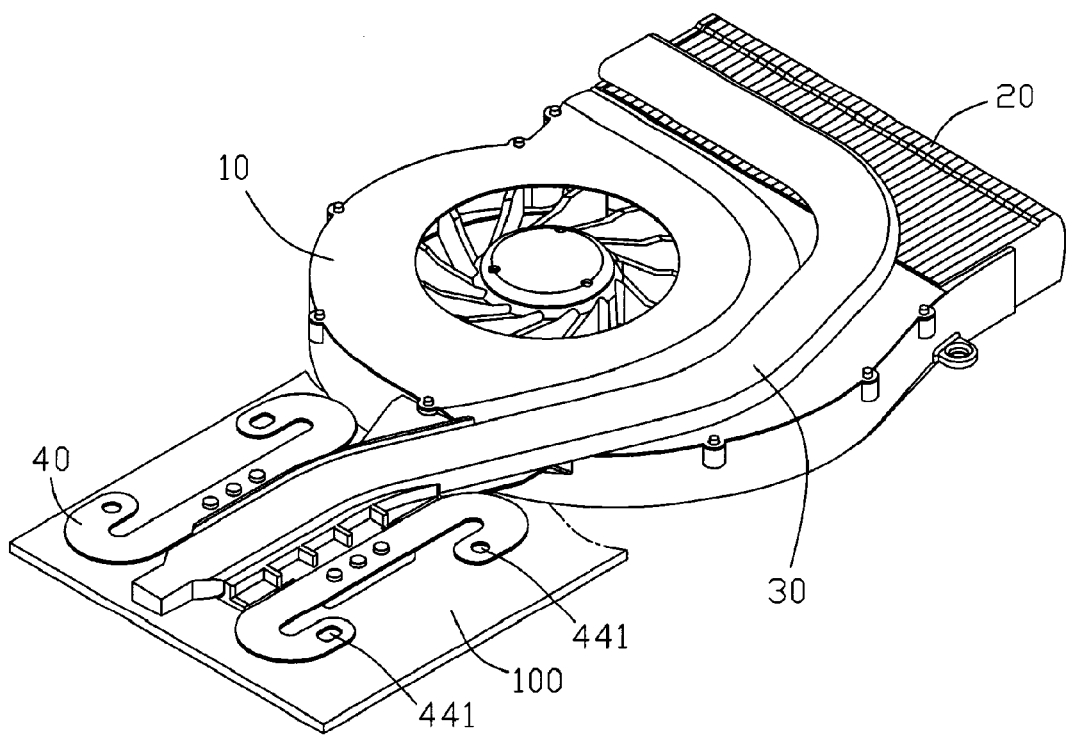
FIG. 2 is an assembled, isometric view of the heat dissipation module of FIG. 1.

Referring to FIGS. 1-2, a heat dissipation module includes a fan 10, a base 106 extending from the fan 10, a heat sink (not labeled) attached to the base 106, and a pair of clips 40 for securing the base 106 to a printed circuit board 100 on which a heat-generating electronic device, such as a CPU 200, is mounted.

The fan 10 includes a housing 11 defining a space (not labeled) therein, and a motor 50 received in the space of the housing 11. A plurality of fan blades 52 extends radially and outwardly from an outer-periphery of the motor 50 for generating forced airflow during rotation of the motor 50. The housing 11 defines an air inlet 54 in a top wall 12 thereof. An air outlet 60 perpendicular to the air inlet 54 is defined in a sidewall 14 of the housing 11.

The base 106 is integrally formed with the housing 11 and extends from an outer periphery of the top wall 12 of the housing 11. The base 106 is located at a side of the fan 10 opposite the air outlet 60 of the housing 11. A pair of flanges 107 extends outwardly from two opposite sides of a distal end 104 of the base 106, respectively. Three pins 109 extend upwardly from each of the flanges 107. The pins 109 of the flanges 107 are arranged symmetric to each other. A through hole 108 is defined in the distal end 104 of the base 106.

The heat sink includes a heat spreader 70, a heat pipe 30 thermally attached to the heat spreader 70, and a fin unit 20 thermally attached to the heat pipe 30. The heat spreader 70 is made of material having relatively high heat conductivity, such as copper or aluminum. The heat spreader 70 has a shape and size the same as that of the through hole 108 and is received in the through hole 108 of the base 106.

The heat pipe 30 is arranged on the base 106. The heat pipe 30 includes an evaporating section 302 and a condensing section 304 at two opposite ends thereof. The evaporating section 302 is arranged on the distal end 104 of the base 106 and attaches to an upper surface 72 of the heat spreader 70 directly. Alternatively, for improving heat conductivity between the heat spreader 70 and the heat pipe 30, thermal interface material such as thermal grease can be filled between the upper surface 72 of the heat spreader 70 and the heat pipe 30. The condensing section 304 of the heat pipe 30 extends from the evaporating section 302 and across the top wall 12 of the housing 11.

The fin unit 20 is arranged at the air outlet 60 of the housing 11, including a plurality of fins 22 stacked together. Each fin 22 has a main body 28 and a pair of hems 26 bent from top and bottom sides of the main body 28. The hems 26 of each fin 22 abut the main body 28 of an adjacent fin 22. Cooperatively the top hems 26 form a top surface 29 of the fin unit 20. The condensing section 304 of the heat pipe 30 contacts with the top surface 29 of the fin unit 20 to dissipate heat to the fin unit 20. A flow channel 24 is defined between the main bodies 28 of any two neighboring fins 22 for the airflow generated by the fan 10 to flow therethrough.

Figure 3:
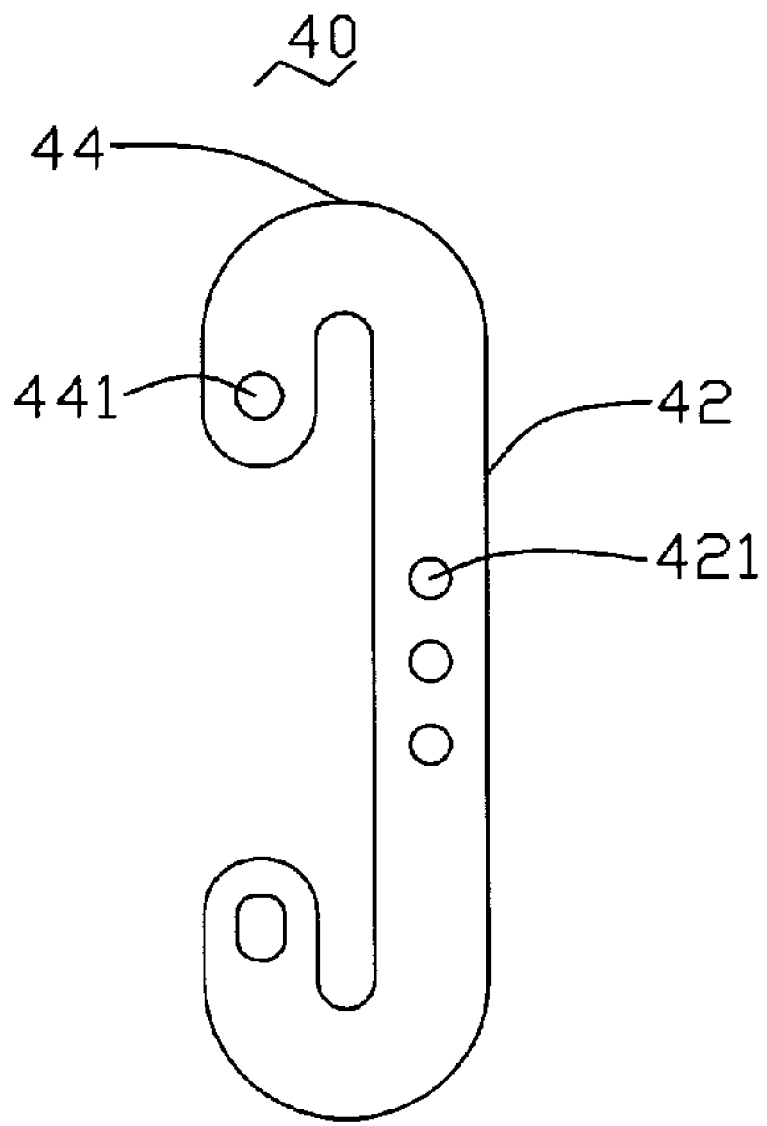
FIG. 3 is a top view of a clip of the heat dissipation module of FIG. 1.

Also referring to FIG. 3, the clips 40 are connected to the flanges 107 of the base 106. Each clip 40 includes a connecting arm 42 at a middle portion thereof and two securing arms 44 at two opposite ends thereof. The connecting arm 42 is elongated and has a rectangular shape. Three locking holes 421 are defined in the connecting arm 42 of each clip 40 corresponding to the pins 109 of each flange 107. Each securing arm 44 of the clip 40 bends reversely from a corresponding end of the connecting arm 42 and extends toward the other end of the connecting arm 42. In other words, free ends (not labeled) of the securing arms 44 face to each other. A securing hole 441 is defined in the free end of each of the securing arms 44. The two securing holes 441 of the clip 40 have shapes different from each other. One of the two securing holes 441 is circular, whilst the other securing hole 441 is oblong. Alternatively, the two securing holes 441 can have the same shape with each other.

When the heat dissipation module is assembled, the fin unit 20 is received in the air outlet 60 of the housing 11. The condensing section 304 of the heat pipe 30 attaches to the top surface 29 of the fin unit 20, and the evaporating section 302 is arranged on the base 106. The heat spreader 70 is received in the through hole 108 of the base 106 with an upper surface 72 thermally connected with the evaporating section 302 of the heat pipe 30. The clips 40 are connected to the flanges 107 of the base 106. The two clips 40 are arranged opposite to each other. The connecting arms 42 of the two clips 40 are mounted on the flanges 107, whilst the securing arms 44 of the two clips 40 are located beyond the base 106. The connecting arms 42 are located closer to each other than the securing arms 44 of the two clips 40. The pins 109 of the flanges 107 of the base 106 extend through the locking holes 421 of the connecting arms 42 of the clips 40 to lock the clips 40 to the heat dissipation module. The pins 109 of the flanges 107 can be fixedly engaged with the locking holes 421 of the clips 40 by riveting or interference fit. The four securing holes 441 of the securing arms 44 of the clips 40 are located around four corners (not labeled) of the base 106. When the heat dissipation module is mounted to the CPU 200, a lower surface (not shown) of the heat spreader 70 opposite to the upper surface 72 is thermally attached to the CPU 200. Screws (not shown) extend through the securing holes 441 of the clips 40 into corresponding mounting holes (not labeled) of the circuit board 100 to secure the heat dissipation module to the circuit board 100, whereby the heat spreader 70 can have an intimate contact with the CPU 200 mounted on the printed circuit board 100.

When the clips 40 engage with the flanges 107, each securing arm 44 of the clips 40 acts as a cantilever which has one end fixed and the other end free. A portion of the connecting arm 42 corresponding to the locking holes 421 acts as the fixed end of the cantilever, whilst a portion of each securing arm 44 corresponding to the securing hole 441 act as the free end of the cantilever. Each screw provides a downward load P to a corresponding securing arm 44. The securing arms 44 of the clips 40 under the downward load P deflect. When the securing arms 44 of the clips 40 undergo a deflection which is in the linearly elastic range, the following equation can be applied to the securing arms 44 of the clips 40: $P=E*Y*W*T3/(4*L3)$, wherein E is the elastic modulus of the cantilever; Y is the displacement of the free end of the cantilever under the load P; W is the width of the cantilever; T is the thickness of the cantilever; and L is the length of the cantilever.

As shown in the above equation, the load P is directly proportional to the displacement Y, whilst is inversely proportional to the cube of the length L. Thus, when the length L between the locking holes 421 and each securing hole 441 of the clips 40 is increased, the load P is approximately constant (i.e., having a small variation) even if the displacement Y of the securing arm 44 has a variation. As the securing arms 44 bend backward from the connecting arm 42, the length L is thus increased. Thus, when the deflection of each of the clips 40 has a variation, the pressure exerted by the clips 40 on the CPU 200 is approximately constant. Therefore, the heat dissipation module is mounted on the CPU 200 with steady pressure. The heat dissipation module can be more reliably attached to the CPU 200, and the heat generated by the CPU 200 can be more reliably absorbed by the heat sink of the heat dissipation module. During operation of the heat dissipation module, the heat generated by the CPU 200 is transferred firstly to the heat spreader 70. Working fluid received in the evaporating section 302 of the heat pipe 30, which thermally attaches the upper surface 72 of the heat spreader 70 absorbs the heat therefrom and evaporates into vapor. The vapor moves from the evaporating section 302 to the condensing section 304 which thermally attaches to the fin unit 20 to dissipate the heat, whereby the vapor cools and condenses at the condensing section 304. The condensed working fluid returns to the evaporating section 302 and evaporates again to thereby repeat the heat transfer from the evaporating section 302 to the condensing section 304. By this way, the heat generated by the CPU 200 is transferred from the heat pipe 30 to the fin unit 20 almost immediately. When the forced airflow generated by the fan 10 flows through the flow channels 24 of the fin unit 20, the heat can be efficiently carried away by the airflow. Therefore, the heat of the CPU 200 can be dissipated immediately.

Figure 4:
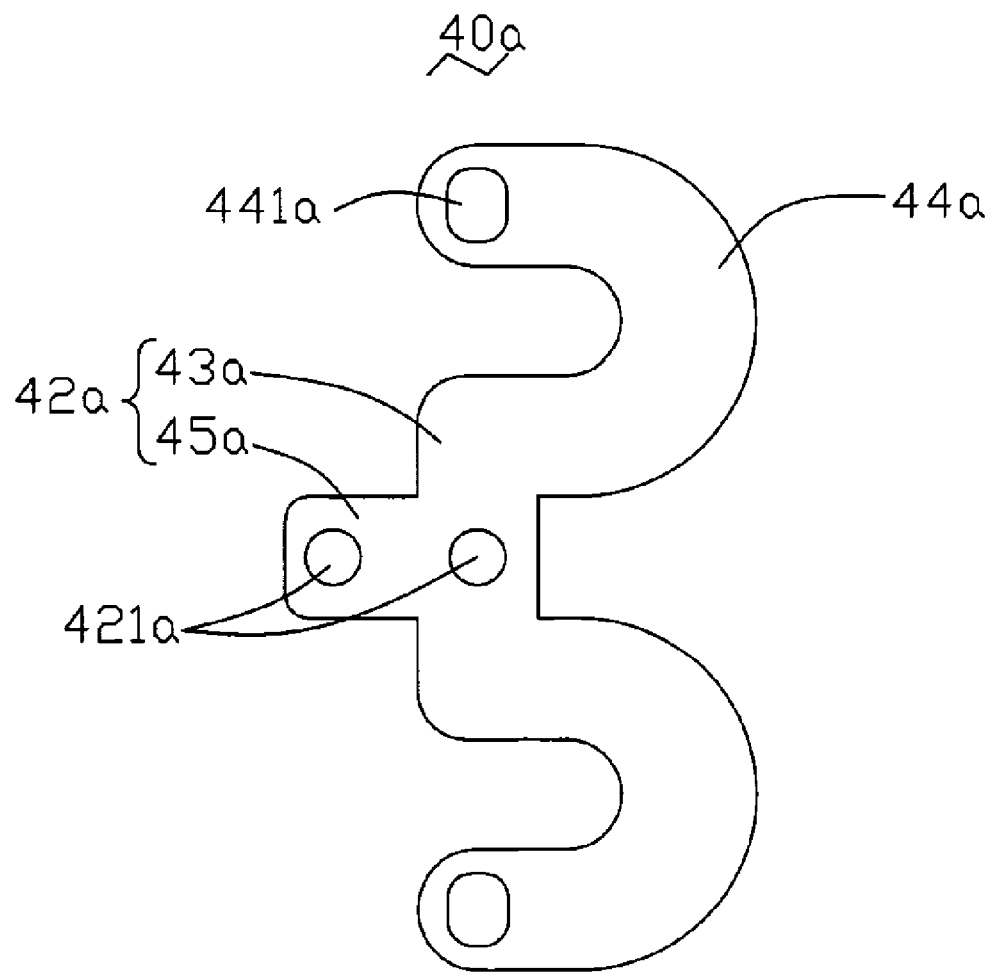
FIG. 4 is a top view of a clip in accordance with a second embodiment of the present invention.
Figure 5:
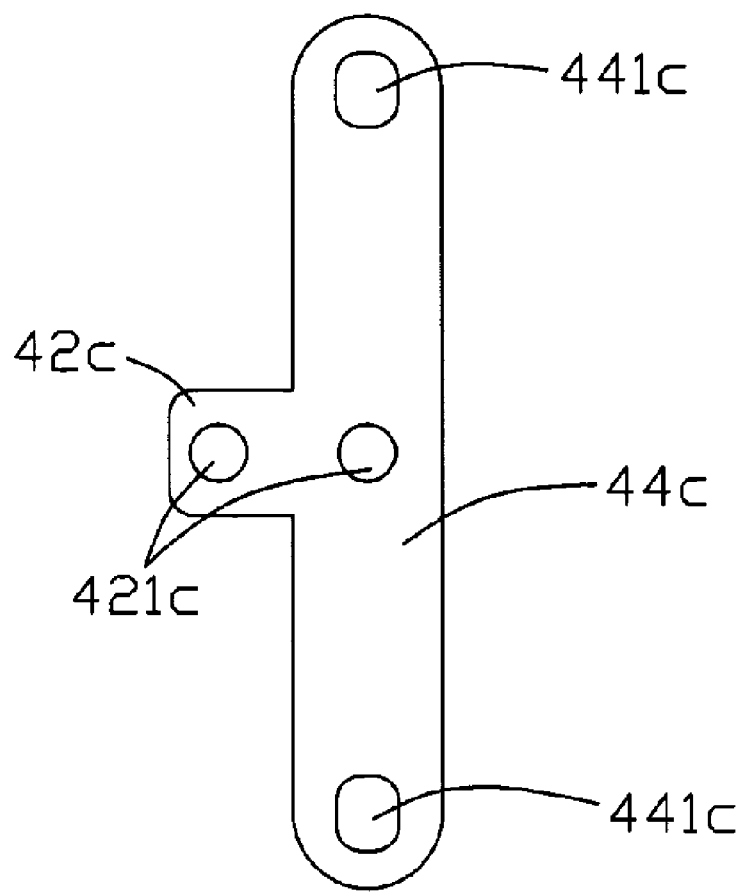
FIG. 5 is a top view of the clip in accordance with related art.

FIG. 4 shows a top view of a clip 40a in accordance with a second embodiment of the present invention. Also the clip 40a has a connecting arm 42a to lock with the heat dissipation module, and a pair of securing arms 44a extending from two opposite ends of the connecting arm 42a. The connecting arm 42a is T-shaped, and includes a first portion 43a and a second portion 45a extending transversely from a middle of the first section 43a. The connecting arm 42a defines two locking holes 421a therein. The locking holes 421a are respectively located in the first and second portions 43a, 45a. to lock the clip 40a to the heat dissipation module, the positions and sizes of the pins 109 of the heat dissipation module can be changed according to the locking holes 421a of the clip 40a. The two securing arms 44a bent from opposite ends of the first portion 43a of the connecting arm 42a, respectively. Each securing arm 44a is U-shaped. Also each securing arm 44a defines a securing hole 441a in a free end (not labeled) thereof, wherein the free ends face a same lateral side of the clip 40a. The two securing holes 441a and the locking hole 421a in the first portion 43a of the connecting arm 42a are aligned with each other. As the securing arms 44a are curve-shaped, the length between each securing hole 441a and the locking holes 421a is increased in comparison with the related art. Thus when a deflection of each of the clips 40a has a variation during mounting of the heat dissipation module to the printed circuit board 100, the pressure exerted by the clips 40a on the CPU 200 remains approximately constant. Accordingly, the heat dissipation module can be reliably mounted on the CPU 200 to have an intimate contact therewith. In both embodiments as shown in FIGS. 3 and 4, the securing arms 44, 44a are in a same horizontal plane with the connecting arms 42, 42a before the free ends of the securing arms 44, 44a are depressed.

While the invention has been described in connection with what is presently considered to be the most practical and preferred embodiment, it is to be understood that the invention is not limited to the disclosed embodiments, but, on the contrary, is intended to accommodate various modifications and equivalent arrangements. The clips 40, 40a in accordance with the preferred embodiments of the present invention comprise a connecting arm 42, 42a and a pair of securing arms 44, 44a extending from the connecting arm 42, 42a. It is can be understood that the size, and the shape of the connecting arm 42, 42a and the securing arms 44, 44a can change according to the heat dissipation module or the space in which the heat dissipation module is mounted. As the securing arms 44, 44a bending from the locking portion 42, 42a, the clips 40, 40a are curve-shaped. The length between the locking holes 421, 421a and the securing holes 441, 441a is thus increased. The influence of variation of the deflection of the clips 40, 40a to the pressure exerted on the CPU 200 by the clips 40, 40a is lessened. Thus, the heat dissipation module can be easily and reliably mounted on the CPU 200.

What is claimed is:

1. A heat dissipation module for removing heat from a heat-generating electronic component, comprising:
   a base adapted for thermally contacting with the heat-generating electronic component; and
   a clip comprising a connecting arm engaging with the base and at least one securing arm for exerting a force on the base adapted for securing the base to the heat-generating electronic component, the at least one securing arm bending from the connecting arm and being curve-shaped, wherein the connecting arm is T- shaped and includes a first portion and a second portion extending transversely from a middle of the first portion, and the securing arms are U-shaped and extend from opposite ends of the first portion of the connecting arm, respectively; and, the force exerted by the at least one securing arm being obtained by depressing a free end of the at least one securing arm to deflect the at least one securing arm, wherein before the depressing the at least one securing arm of each clip is at a same horizontal plane with the connecting arm.

2. The heat dissipation module of claim 1, wherein each of the connecting arms is elongated and has a rectangular shape, and the securing arms bend backward toward each other from the two opposite ends of the connecting arm.

3. The heat dissipation module of claim 1, wherein a securing hole is defined in each of the securing arms, the two securing holes having shapes different from each other.

4. The heat dissipation module of claim 3, wherein one of the two securing holes is circular-shaped, and the other securing hole is oblong.

5. The heat dissipation module of claim 1, wherein the connecting arm defines at least a locking hole therein, and the base forms at least a pin engaged with the at least a locking hole of the connecting arm to lock the clip with the base.

6. The heat dissipation module of claim 1, wherein the clip comprises a pair of clips arranged symmetrically on the base, and the at least one securing arm of each clip is at a same horizontal plane with the connecting arm.

7. The heat dissipation module of claim 1, further comprising a fan arranged at a side of the base, a fin unit arranged at an air outlet of the fan, and at least a heat pipe comprising an evaporating section adapted for thermally attaching to the heat-generating electronic component and a condensing section thermally attaching to the fin unit.

8. The heat dissipation module of claim 7, wherein a through hole is defined in the base and a heat spreader is received in the base, the heat spreader comprising a first surface for thermally attaching to the heat-generating electronic component and a second surface opposite to the first surface for attaching to the heat pipe.

9. The heat dissipation module of claim 7, wherein the fan includes a housing and a motor received in the housing for generating forced airflow, and the base is integrally formed with the housing of the fan.

10. A heat dissipation module, comprising:
    a circuit board;
    a heat generating electronic device mounted on the circuit board;
    a base mounted on the heat generating electronic device; and
    a clip having a connecting arm locking with the base and a pair of securing arms extending from opposite ends of the connecting arm and engaged with the circuit board, the securing arms being curve-shaped and having free ends thereof facing to each other and being depressed toward the circuit board, wherein before being depressed, the securing arms are at a same horizontal plane with the connecting arm wherein the connecting arm is T-shaped, comprising a first portion and a second portion extending transversely from a middle of the first portion, the securing arms extending from opposite ends of the first portion of the connecting arm, respectively.

11. The heat dissipation module of claim 10, wherein the connecting arm has an elongated, rectangular shape.

12. The heat dissipation module of claim 11, wherein the securing arms are U-shaped with free ends thereof facing to each other.

13. The heat dissipation module of claim 10, wherein the free ends of the securing arms face a same lateral side of the clip.

14. A heat dissipation module comprising:
    a fan for generating a forced air flow through an outlet thereof;
    a fin unit mounted in the outlet of the fan;
    a base adapted for thermally connecting with a heat-generating electronic component;
    a clip having a middle portion attached to the base and two securing portions extending curvedly from two opposite ends of the middle portion, wherein free ends of the securing portions each defines a hole adapted for receiving a force for depressing the securing portions in relative to the middle portion; and insert the middle portion is T-shaped, comprising a first portion and second portion, the second portion extending transversely from the first portion, and the middle portion is at a same horizontal plane as the securing portion; and a heat pipe having an evaporating section adapted for thermally connecting with the heat-generating electronic component and a condensing section thermally connecting with the fin unit.

15. The heat dissipation module of claim 14, wherein the free ends face toward each other.

16. The heat dissipation module of claim 14, wherein the free ends face a same lateral side of the clip.

17. The heat dissipation module of claim 14, wherein the two holes have different shapes with one being round and the other being oblong.

* * * * *